(12) United States Patent
Al-Badrawi et al.

(10) Patent No.: US 11,169,190 B2
(45) Date of Patent: Nov. 9, 2021

(54) TECHNIQUES FOR EMPIRICAL MODE DECOMPOSITION (EMD)-BASED NOISE ESTIMATION

(71) Applicant: The University of New Hampshire, Durham, NH (US)

(72) Inventors: Mahdi H. Al-Badrawi, Durham, NH (US); Nicholas J. Kirsch, Portsmouth, NH (US); Bessam Z. Al-Jewad, Madbury, NH (US)

(73) Assignee: THE UNIVERSITY OF NEW HAMPSHIRE, Durham, NH (US)

( * ) Notice: Subject to any disclaimer, the term of this patent is extended or adjusted under 35 U.S.C. 154(b) by 174 days.

(21) Appl. No.: 16/334,345

(22) PCT Filed: Sep. 19, 2017

(86) PCT No.: PCT/US2017/052302
§ 371 (c)(1),
(2) Date: Mar. 18, 2019

(87) PCT Pub. No.: WO2018/053525
PCT Pub. Date: Mar. 22, 2018

(65) Prior Publication Data
US 2019/0212378 A1    Jul. 11, 2019

Related U.S. Application Data

(60) Provisional application No. 62/396,290, filed on Sep. 19, 2016.

(51) Int. Cl.
*G01R 23/20*    (2006.01)
*G06F 17/14*    (2006.01)

(52) U.S. Cl.
CPC ............. *G01R 23/20* (2013.01); *G06F 17/14* (2013.01)

(58) Field of Classification Search
CPC ................................ G01R 23/20; G06F 17/14
(Continued)

(56) References Cited

U.S. PATENT DOCUMENTS

| 3,937,899 A * | 2/1976 | Denenberg ............ H04Q 1/4575 |
| | | 702/74 |
| 2003/0033094 A1* | 2/2003 | Huang .................... G06F 17/14 |
| | | 702/39 |

(Continued)

OTHER PUBLICATIONS

M. H. Al-Badrawi, N. J. Kirsch and B. Z. Al-Jewad, "Intrinsic Mode Function Based Noise Power Estimation With Applications to Semiblind Spectrum Sensing Methods," in IEEE Signal Processing Letters, vol. 24, No. 7, pp. 1088-1092, Jul. 2017, doi: 10.1109/LSP.2017.2710883 (Year: 2017).*

(Continued)

*Primary Examiner* — Eman A Alkafawi
*Assistant Examiner* — Aeysha N Sultana
(74) *Attorney, Agent, or Firm* — Grossman, Tucker, Perrault & Pleger, PLLC (57) ABSTRACT

An Empirical Mode Decomposition (EMD)-based noise estimation process is disclosed herein that allows for blind estimations of noise power for a given signal under test. The EMD-based noise estimation process is non-parametric and adaptive to a signal, which allows the EMD-based noise estimation process to operate without necessarily having a priori knowledge about the received signal. Existing approaches to spectrum sensing such as Energy Detector (ED) and Maximum Eigenvalue Detector (MED), for example, may be modified to utilize a EMD-based noise estimation process consistent with the present disclosure to shift the same from semi-blind category to fully-blind category.

15 Claims, 9 Drawing Sheets

(58) Field of Classification Search
USPC .......................................................... 702/69
See application file for complete search history.

(56) References Cited

U.S. PATENT DOCUMENTS

| | | | |
|---|---|---|---|
| 2010/0309317 A1* | 12/2010 | Wu ...................... | H04B 1/1027 348/180 |
| 2012/0142382 A1* | 6/2012 | Stanforth ............. | G06Q 10/063 455/500 |
| 2013/0057433 A1 | 3/2013 | Sadler | |
| 2015/0181436 A1* | 6/2015 | Kathuria ............... | H04W 16/14 455/509 |
| 2016/0028568 A1 | 1/2016 | Kirsch et al. | |

OTHER PUBLICATIONS

L. Zão, R. Coelho and P. Flandrin, "Speech Enhancement with EMD and Hurst-Based Mode Selection," in IEEE/ACM Transactions on Audio, Speech, and Language Processing, vol. 22, No. 5, pp. 899-911, May 2014, doi: 10.1109/TASLP.2014.2312541 (Year: 2014).*

International Search Report and Written Opinion dated Nov. 27, 2017 in corresponding PCT Patent Application No. PCT/US2017/052302.

* cited by examiner

| Estimation method | SNR (dB) | | | | |
|---|---|---|---|---|---|
| | -30 | -20 | -10 | 0 | 10 |
| | Estimation error (%) | | | | |
| Wavelet | 1.49 | 0.90 | 6.53 | 18.4 | 21.81 |
| Forward | 1.00 | 1.10 | 9.86 | 11.78 | 13.61 |
| $\beta$ | 2.75 | 2.85 | 2.83 | 2.84 | 9.65 |

TECHNIQUES FOR EMPIRICAL MODE DECOMPOSITION (EMD)-BASED NOISE ESTIMATION

CROSS REFERENCE TO RELATED APPLICATION

The present application claims the benefit of the filing date of U.S. Provisional Application Ser. No. 62/396,290, filed Sep. 19, 2016, the entire teachings of which are hereby incorporated herein by reference.

TECHNICAL FIELD

The present disclosure relates to communication of information, and more particularly, to a system and method using empirical mode decomposition for noise estimation.

BACKGROUND

Noise estimation plays a significant role in signal processing. For instance, RADAR and other signal detection systems utilize noise estimation to filter or otherwise condition signals during detection processes.

Other systems such as Cognitive Radio (CR) systems also utilize noise estimation when, for instance, determining bandwidth availability. There is a great demand for bandwidth in wireless communications due to the dramatic shift in data usage from voice only to multimedia applications. Cognitive Radio (CR) systems were proposed as a solution to satisfy that demand by making the under-utilized spectrum available. Spectrum sensing is a key part CR systems, and allows secondary users (SUs) to detect spectrum owned by a licensed or primary user (PU). Different spectrum sensing methods operate at different levels of "blindness," with blindness generally referring to the ability of a given spectrum sensor to effectively function without a priori knowledge of the PU channel statistics, such as noise. Spectrum sensing systems must adapt to use different spectrum and bandwidths based on a primary user's channel usage. Noise estimation plays a role in enhancing the performance of noise-dependent spectrum sensing techniques. In practice, the knowledge of noise variance is not available and hence noise variations of the wireless channel and the thermal noise in the receiver might degrade the detector efficacy.

The technique used for sensing the occupied and available spectrum in a cognitive radio system is an important aspect of the system. Several spectrum sensing techniques are known, each of which has advantages and disadvantages. These techniques range from low to high computation complexity and have various levels of performance in determining the presence of signals in noise.

BRIEF DESCRIPTION OF THE DRAWINGS

Reference should be made to the following detailed description which should be read in conjunction with the following figures, wherein like numerals represent like parts.

DETAILED DESCRIPTION

Spectrum occupancy analysis generally includes utilizing a measured/known noise power to derive a detection threshold, and ultimately determining occupancy for a channel/bandwidth under test based on the detection threshold. Numerous semi-blind noise-estimation methods have been proposed such as, for example, forward consecutive mean excision (FCME) and forward cell averaging (CA), which are used to estimate the level of the noise for a certain false alarm rate. Other approaches include using eigenvalue groups of a sample covariance matrix which are then split using minimum descriptive length (MDL). In these approaches, a goodness of fit for probability distribution function (PDF) of the noise eigenvalues is used to estimate the noise power. Still other approaches utilize Wavelet, which use Wavelet de-noising to estimate the noise power by subtracting the de-noised version from the received noisy signal. Each of the aforementioned methods have particular usage scenarios that enable relatively good performance when signal characteristics are at least partially known, e.g., noise power. However, each is limited by noise variance, spectral efficiency, false alarm rate, sampling rate, and adaptivity.

Thus, in accordance with an embodiment of the present disclosure, an Empirical Mode Decomposition (EMD)-based noise estimation process is disclosed herein that allows for blind estimations of noise power for a given signal under test. The EMD-based noise estimation process is non-parametric and adaptive to a signal, which allows the EMD-based noise estimation process to operate without necessarily having a priori knowledge about the received signal. Existing approaches to spectrum sensing such as Energy Detector (ED) and Maximum Eigenvalue Detector (MED), for example, may be modified to utilize a EMD-based noise estimation process consistent with the present disclosure to shift the same from semi-blind category to fully-blind category.

While aspects and embodiments specifically reference spectrum sensing in cognitive radio (CR) systems, this disclosure is not limited in this regard. For instance, the techniques disclosed herein may be implemented within any system that seeks to quantify noise power for a given signal. Thus, EMD-based noise estimation consistent with the present disclosure may be applicable to wide-range of systems/devices such as, for example, RADAR systems, signal detectors, coherent detectors (e.g., ED, MED), or any system that may utilize knowledge of noise variance for detection/operational purposes.

Figure 1:
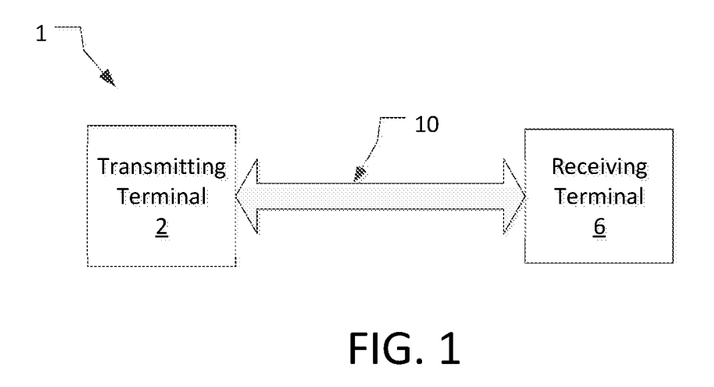
FIG. 1 is a block diagram of one exemplary embodiment of a system consistent with the present disclosure.

Turning to the Figures, FIG. 1 is a simplified block diagram of one example embodiment of a communication system 1 consistent with the present disclosure. The system 1 has been depicted as a highly-simplified point-to-point system for ease of explanation. The system 1 includes transmitting terminal 2 and a receiving terminal 6 for transmitting and receiving signals over a communication path 10. The communication path 10 may include any medium for carrying signals from the transmitting terminal 2 to the receiving terminal 6. For example, the communication path 10 may include one or more electrical cables, optical cables and/or the path may be a wireless path. If the path 10 is a wireless path, the transmitting terminal 2 and the receiving terminal 6 may include associated antennas (not shown) for transmitting and receiving wireless signals. Although the system is shown as communicating signals from the transmitting terminal 2 to the receiving terminal 6, the transmitting terminal 2 and receiving terminal 6 may both be configured as transceivers to allow bi-directional communication therebetween.

In general, the receiving terminal 6 may include an EMD-based noise estimator for determining the noise power of a received signal. The receiving terminal 6 may further include an energy detector (or detector) for detecting occupied and/or available spectral portions of a bandwidth of interest. One example energy detector suitable for use in the receiving terminal 6 is an EMD-based energy detector disclosed and discussed in greater detail in the U.S. application Ser. No. 14/789,398 ('398 application) entitled "Empirical Mode Decomposition for Spectrum Sensing in Communication Systems", which is incorporated by reference herein in its entirety.

As used herein, the term "available" when used to describe spectrum or bandwidth shall refer to spectral portions of the bandwidth of interest that are not carrying information signals, and the term "occupied" when used to describe spectrum or bandwidth shall refer to spectral portions of the bandwidth of interest that are carrying information signals.

When the system 1 is configured as a cognitive radio system, it may be configured for close range or long range wireless communication between the transmitting terminal and the receiving terminal 2, 6 respectively. The term, "close range communication" is used herein to refer to systems and methods for wirelessly sending/receiving data signals between devices that are relatively close to one another. Close range communication includes, for example, communication between devices using a BLUETOOTH™ network, a personal area network (PAN), near field communication, ZigBee networks, an Wireless Display connections, millimeter wave communication, ultra high frequency (UHF) communication, combinations thereof, and the like. Close range communication may therefore be understood as enabling direct communication between devices, without the need for intervening hardware/systems such as routers, cell towers, internet service providers, and the like.

In contrast, the term "long range communication" is used herein to refer to systems and methods for wirelessly sending/receiving data signals between devices that are a significant distance away from one another. Long range communication includes, for example, communication between devices using Wi-Fi, a wide area network (WAN) (including but not limited to a cell phone network), the Internet, a global positioning system (GPS), a whitespace network such as an IEEE 802.22 WRAN, combinations thereof and the like. Long range communication may therefore be understood as enabling communication between devices through the use of intervening hardware/systems such as routers, cell towers, whitespace towers, internet service providers, combinations thereof, and the like.

Figure 2A:
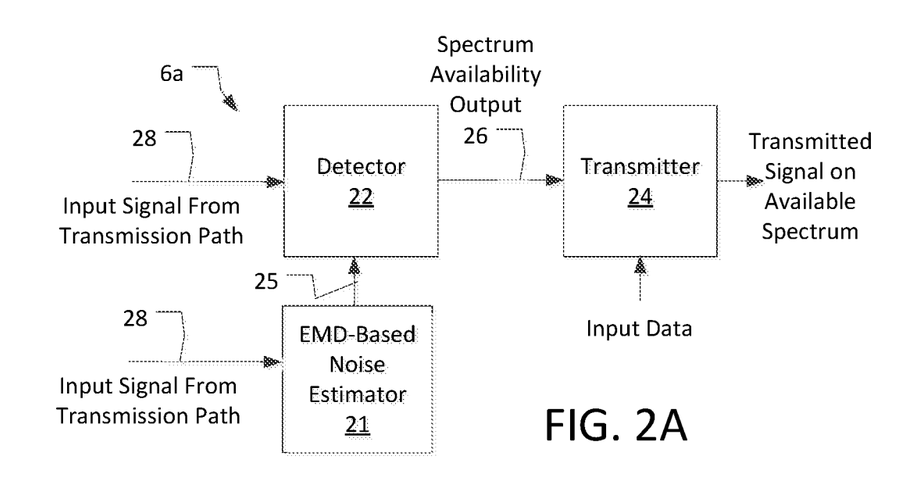
FIG. 2A is a block diagram of one exemplary embodiment of a receiving terminal consistent with the present disclosure.
Figure 2B:
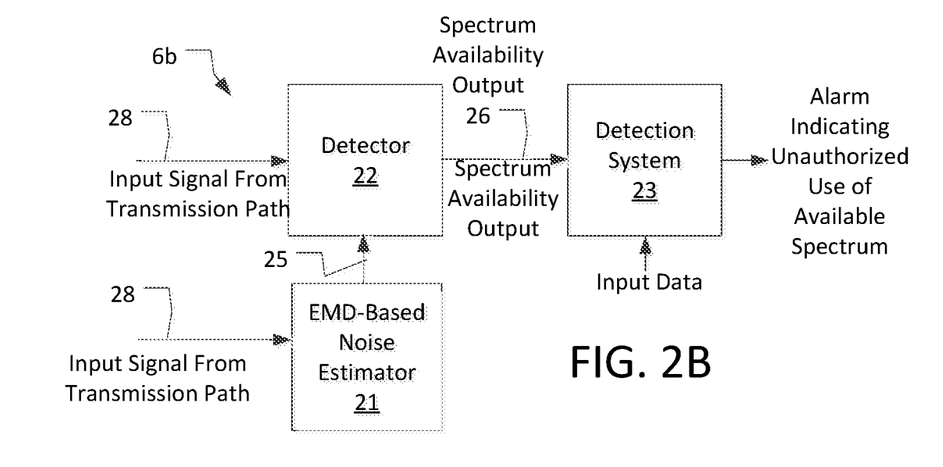
FIG. 2B is a block diagram of another exemplary embodiment of a receiving terminal consistent with the present disclosure.

FIGS. 2A and 2B are block diagrams of example embodiments 6a, 6b, respectively, of a receiving terminal 6 (FIG. 1) consistent with the present disclosure. The block diagrams in FIGS. 2A and 2B are shown in highly simplified form for ease of explanation. A receiving terminal consistent with the present disclosure may include known configurations of other components, e.g. a power supply, data modulation components, transmission components, etc., configured for receiving data signals of a particular type depending on the application.

The embodiment 6a illustrated in FIG. 2A includes an EMD-based noise estimator 21, a detector 22, and a transmitter 24, such as a cognitive radio system. In general, the EMD-based noise estimator 21 receives an input signal 28 from the transmission path 10 (FIG. 1), and uses an EMD-based noise estimation process to provide a noise power output 25 to the detector 22, which may be implemented as an EMD-based energy detector as discussed in the '398 application. The noise power output 25 may be used to derive a detection threshold, which then may be utilized to determine the occupancy status of a target channel(s). For instance, relative power that does not exceed the threshold indicates that the channel is available. Therefore, the detector 22 may then receive the input signal 28 from the transmission path (10), and use the noise power output 25 from the EMD-based noise estimator 21 to provide a spectrum availability output 26 for the input signal 28 to the transmitter 24. The spectrum availability output 26 indicates which portions of a bandwidth of interest are available for use (i.e. are whitespaces) by the transmitter 24 for communicating information signals.

The transmitter 24 uses the spectrum availability output 26 to identify available spectrum and may transmit signals on the available spectrum. In an embodiment wherein the transmitter 24 is a cognitive radio system, for example, the transmitter 24 may be configured to receive input data from a data source (not shown) and transmit a signal or signals on available spectrum in response to the spectrum availability output from the detector 22. The transmitter 24 may be configured for transmitting a signal on available spectrum in response to the spectrum availability output of the detector 22. The transmitter 24 is shown in a highly simplified form and may include a known RF circuit, power supply, antenna, and so on for transmitting an output signal.

The embodiment 6b illustrated in FIG. 2B includes an EMD-based noise estimator 21 consistent with the present disclosure coupled to a detection system 23 by way of detector 22. As described in connection with FIG. 2A, the EMD-based noise estimator 21 receives an input signal 28 from the transmission path 110 (FIG. 1), and uses an EMD-based noise estimation process to provide a noise power output 25 to the detector 22. In turn, the detector 22 receives the input signal 28 from the transmission path 110 (FIG. 1), and uses an energy detection process, e.g., an EMD-based energy detection process or other suitable approach, in combination with the noise power output 25 to provide a spectrum availability output 26. The detection system 23 uses the spectrum availability output 26 to determine portions of a bandwidth of interest that are inappropriately carrying information signals.

For example, the detection system 23 may be configured to use the spectrum availability output 26 to identify the available spectrum in the bandwidth of interest. The detection system 23 may then compare the available spectrum to an expected available spectrum to determine the extent to which the available spectrum in the bandwidth of interest differs from the expected available spectrum. Differences between the available spectrum and the expected available spectrum may indicate that portions of the available spectrum are carrying information signals when they should not be carrying information signals, e.g. there is unauthorized use of frequencies or wavelengths within the bandwidth of interest. The detection system 23 may provide an alarm output to indicate intentional or unintentional unauthorized use of the available spectrum.

Figure 3:
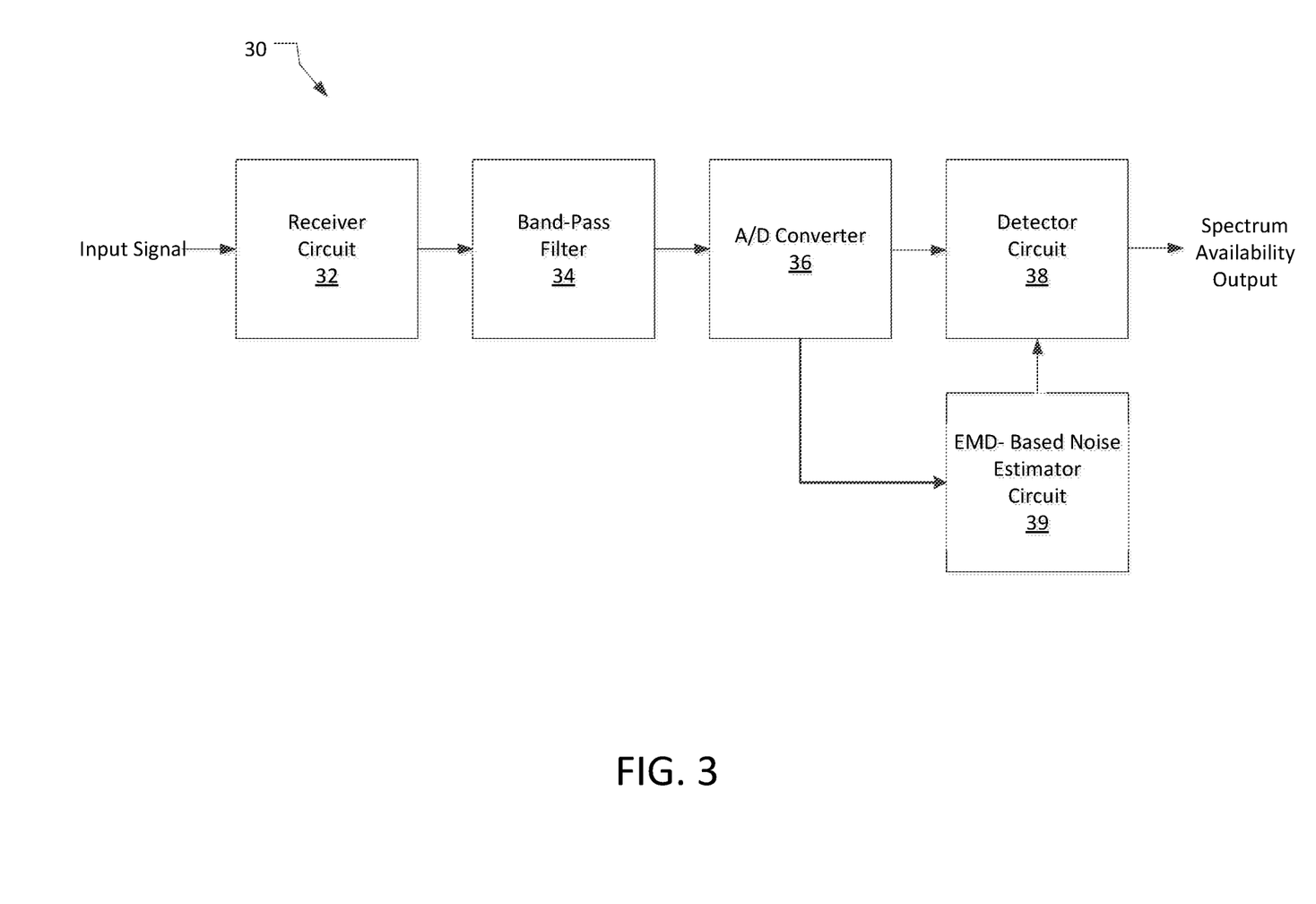
FIG. 3 is a block diagram of one exemplary embodiment of an EMD-based noise estimator consistent with the present disclosure.

The EMD-based noise estimator 21 and detector 22 may be provided in a variety of configurations. One example embodiment 30 of an EMD-based noise estimator and EMD-based energy detector consistent with the present disclosure is illustrated in FIG. 3. The embodiment 30 includes a receiver circuit 32, a band-pass filter 34, an analog-to-digital (A/D) converter 36, an energy detector circuit 38, and an EMD-based noise estimator circuit 39.

The receiver circuit 32 may be a known circuit configured for receiving an input signal from the communication path 110, e.g. directly from the path or from an antenna if the signal is a wireless signal, and providing an analog output signal representative of the received input signal. The analog output of the receiver circuit 32 is coupled to the band-pass filter 34. The band-pass filter 34 may take a known fixed or tunable configuration for receiving the analog output of the receiver 32 and passing only portion of the bandwidth of the analog output, i.e. a bandwidth of interest, to the A/D converter 36. For example, in the context of a cognitive radio system using an IEEE 802.22 WRAN, the band-pass filter 34 may be configured to pass only a portion of the analog signal within the dedicated TV band specified by IEEE 802.22. The A/D converter 36 may be configured to oversample (e.g. 10 times the highest frequency) the output band-pass filter 34 to provide a digital output representative of the output of the band-pass filter 34. A variety of A/D converter configurations useful as the A/D converter 36 are well known.

The digital output of the A/D converter 36 is coupled as an input signal to the EMD-based noise estimator circuit 39. The EMD-based noise estimator circuit 39 receives the digital output of the A/D converter 36 and provides a noise power output which indicates the noise power for the input signal. The EMD-based noise estimator 39 implements an EMD-based noise estimation process consistent with the present disclosure to provide the noise power output for the bandwidth of interest. For example, the EMD-based noise estimator 39 may be a controller implemented as a field programmable gate array (FPGA) and/or using digital signal processing (DSP). As is known, DSP involves processing of signals using one or more application specific integrated circuits (ASICS) and/or special purpose processors configured for performing specific instruction sequences, e.g. directly and/or under the control of software instructions.

Likewise, the digital output of the A/D converter 36 may also be coupled as an input signal to the detector circuit 38. The output, e.g., noise power output, of the EMD-based noise estimator circuit 39 may also be coupled as an input signal to the detector circuit 38. The detector circuit 38 may comprise, for example, an EMD-based energy detector circuit, although other types of detector circuits are within the scope of this disclosure. For instance, the detector circuit 38 may comprise a RADAR circuit, a signal detector circuit, or any other type of detector circuit that operates at least in part on noise estimation for a received signal.

The detector circuit 38 thus receives the digital output of the A/D converter 36 and the noise power output and provides a spectrum availability output based on the same which indicates the available spectrum in the bandwidth of interest. The detector circuit 38 may also be a controller, as discussed above with regard to the EMD-based noise estimator 39.

In general, the EMD-based noise estimation circuit 39 provides noise power output by using an EMD process, as discussed in greater detail below. Likewise, the detector circuit 38 may provide the spectrum availability output by using EMD to determine frequency-domain intrinsic mode functions (IMFs).

In any event, the noise power may be derived from the signal itself, using the nature of IMFs. Likewise, the occupied spectrum may be differentiated from available spectrum, which is occupied only by noise, using the nature of IMFs. The IMFs may be de-noised, and a data-driven detection threshold is calculated using the IMFs. Detection of the available spectrum is performed using the data-driven detection threshold.

EMD is a known non-linear decomposition process utilized to analyze and represent non-stationary real world signals. In general, EMD decomposes a time series signal into the IMFs, e.g., $IMF_1$ to $IMF_X$, which are simple harmonic functions collected through an iterative process. The iterative procedure (known as sifting) eliminates most of the signal anomalies and makes the signal wave profile more symmetric. This enables further processing to decompose the bandwidth of interest. The frequency content embedded in the processed IMFs reflects the physical meaning of the underlying frequencies.

In an EMD process, the IMFs of the input signal may be decomposed as $IMF_1$, $IMF_2$ and $IMF_3$, and so on. Relative power exceeding a noise threshold (or detection threshold) in any channel of an IMF indicates that the channel is occupied. The noise threshold may be derived from the noise power output of the EMD-based noise estimator circuit 39.

Thus, relative power that does not exceed the noise threshold in any channel of an IMF indicates that the channel is available.

Figure 4:
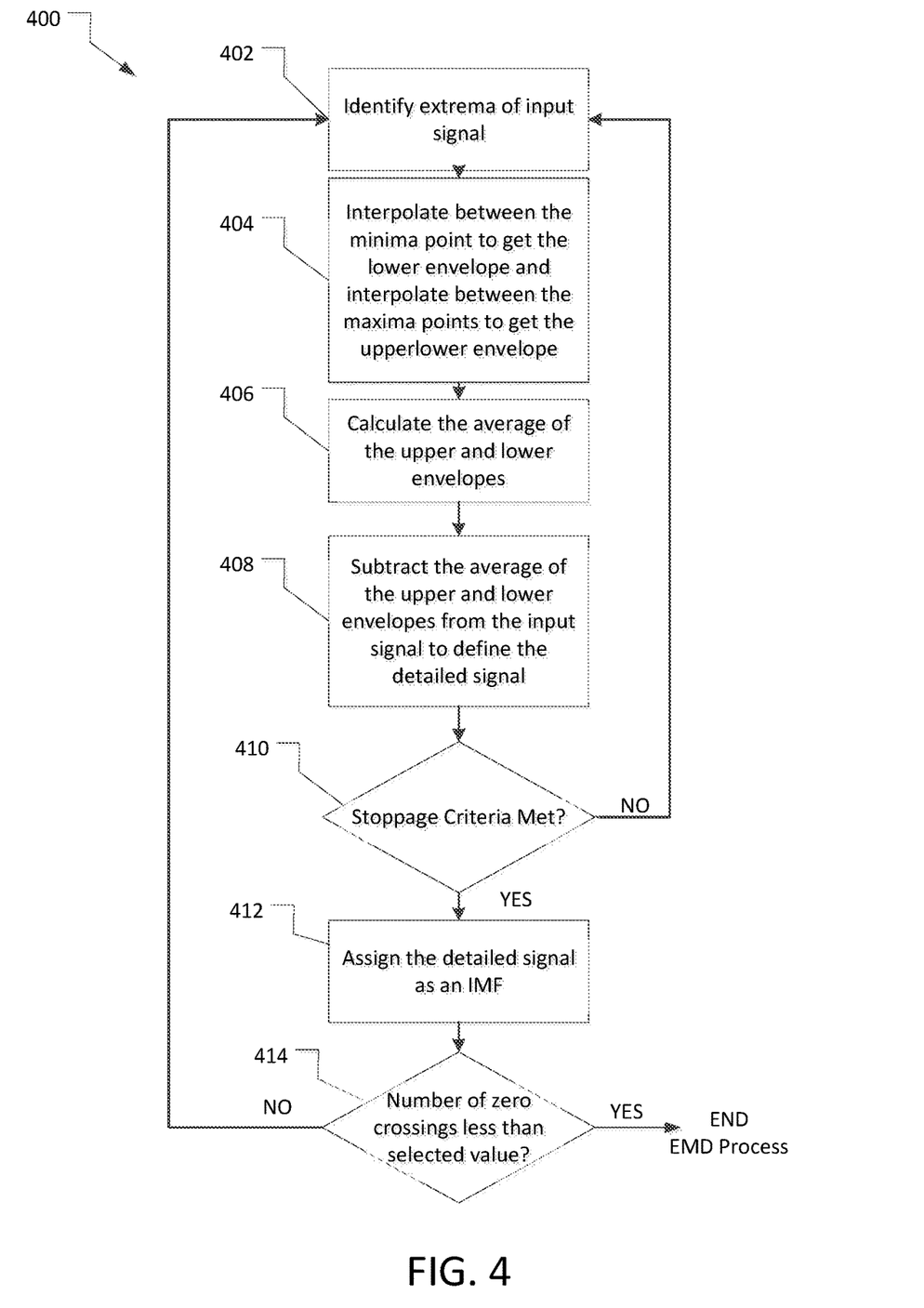
FIG. 4 diagrammatically illustrates operation of an EMD process consistent with the present disclosure.

An EMD process may be implemented in a variety of ways. FIG. 4 is a flow chart illustrating one exemplary EMD process 400 useful in connection with a system and method consistent with the present disclosure. While flowcharts presented herein illustrate various operations according to example embodiments, it is to be understood that not all of the depicted operations are necessary for other embodiments. Indeed, it is fully contemplated herein that in other embodiments of the present disclosure, the depicted operations, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

In the illustrated embodiment, the EMD process may begin by identifying 402 the extrema of an input signal x(t), i.e. $x_{max}(t)$ and $x_{min}(t)$. An interpolation 404 between the minima points may be performed 404 to define a lower envelope or $e_{min}(t)$), and an interpolation between the maxima points may be performed to define an upper envelope $e_{max}(t)$. The averages of the upper and lower envelopes may then be calculated 406 as:

$$m(t) = \frac{(e_{max}(t) + e_{min}(t))}{2} \quad \text{(Equation 1)}$$

The detailed signal may then be defined as 408 as: d(t)=x(t)−m(t). If a stoppage criteria is not met 410, then the process may return to step 402 to iterate using a new input signal. If the stoppage criteria 410 has been satisfied, the detailed signal is assigned 412 as an IMF. If the number of zero crossings is less than a selected value 414, e.g. 2, then the EMD process may end, otherwise additional IMFs may be calculated, e.g. by subtracting d(t) from the input signal to define a residue and assigning the residue as a new input signal and iterating the process.

The stoppage criteria may be selected and/or applied in a number of ways to set the number of iterations in the EMD process. In one embodiment, the stoppage criteria may be selected to ensure that the difference between successive residue calculations is small. For example, a Cauchy convergence test may be used to determine whether the normalized squared difference between two successive residue calculations is less than a selected value, e.g. (0.2 or 0.3). If a given an input signal x(t) in any iteration satisfies the stoppage criteria and the number of extrema and zero crossings differ by one, then the input signal may be assigned as an IMF and the EMD process may end.

From frequency-domain perspective, EMD acts like a dyadic filter bank, where the subsequent IMFs (except for the first IMF) behave similar to overlapping bandpass filters. The core part of the sifting process relies on interpolating the extrema (maxima/minima) points, as discussed above. Therefore, oversampling allows for extracting each of the local oscillations through the sifting procedure.

This disclosure has identified that the first IMF, i.e., $IMF_1$, may be used for noise estimation. The EMD sifting process captures the highest frequencies in $IMF_1$. However, for noisy signals, $IMF_1$ may include low-band frequencies (e.g., possibly PU/SU signals) when the sampling rate is not sufficient and/or the noise power is too low.

The probability distribution function (PDF) of $IMF_1$ for an input Gaussian processes is a mix of two normal distributions represented by the Gaussian mixture (bimodal) distribution. The justification of the bi-modality in such a distribution lies in the large discrepancy of values (in case of noisy or noise only signals) yielded by the maxima and minima envelops. The first IMF, denoted by $c_1(n)$, follows the PDF:

$$f(c_1(n)) = \frac{\varepsilon}{\sqrt{2\pi\sigma_u^2}}e^{-\frac{(c_1(n)-\mu_u)^2}{2\sigma_u^2}} + \frac{1-\varepsilon}{\sqrt{2\pi\sigma_l^2}}e^{-\frac{(c_1(n)-\mu_l)^2}{2\sigma_l^2}} \quad \text{(Equation 2)}$$

where $\mu_u$, $\sigma_u$, $\mu_l$, $\sigma_l$ are the mean and the standard deviation for upper and lower mode distributions respectively, and $\varepsilon \in [0,1]$ represents the mode distribution weight.

As discussed above, IMFs can be interpreted as a dyadic filter bank that resembles the behavior of wavelets. However, unlike the filtering properties of wavelets, the EMD non-linear decomposition process introduces different cutoff frequencies.

Figure 5:
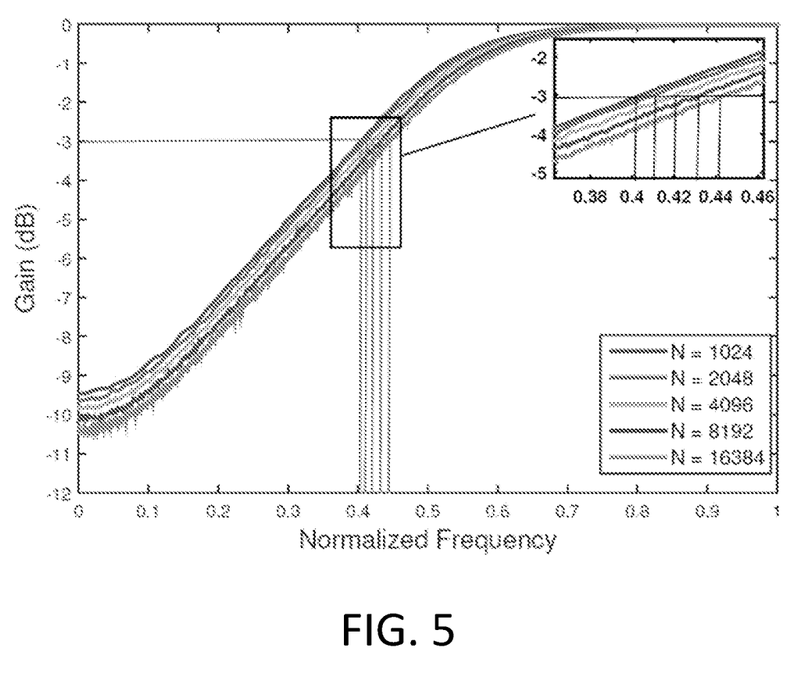
FIG. 5 includes plots of normalized frequency response of $IMF_1$ for different values of N consistent with the present disclosure.

FIG. 5 illustrates the normalized frequency response for the power spectral density (PSD) of $c_1(n)$ of a noise only input signal w(n) for 5000 averaged trials. This figure shows the adaptive high-pass filtering characteristic of $IMF_1$ and how the sampling rate impacts the cutoff frequency. The first IMF, under sufficient sampling rates, is dominated by noise and thus can be exploited to estimate the noise power of a received signal.

An empirical ratio of the first IMF power to the total noise power of the received signal denoted by β is:

$$\beta = \frac{\hat{\sigma}_{c_1}^2}{\sigma_w^2} \quad \text{(Equation 3)}$$

where $\hat{\sigma}_{c_1}^2$ is the estimated variance of $c_1(n)$ and $\sigma_w^2$ is the total noise power of the received signal.

The first IMF, $c_1(n)$, may be modeled as a bimodal zero-mean normal process with a variance of $\sigma_{c_1}^2$ i.e. $c_1(n) \sim \mathcal{N}(0, \sigma_{c_1}^2)$. The variance of each mode distribution in Equation (2) is estimated using maximum-likelihood parameter estimation via Expectation Maximization (EM) algorithm. The estimated overall variance of $IMF_1$, denoted by $\hat{\sigma}_{c_1}^2$, may be given as:

$$\hat{\sigma}_{c_1}^2 = \varepsilon\hat{\sigma}_u^2 + (1-\varepsilon)\hat{\sigma}_l^2 + \varepsilon(1-\varepsilon)(\hat{\mu}_u - \hat{\mu}_l)^2 \quad \text{(Equation 4)}$$

where $\hat{\sigma}_u^2$, $\hat{\sigma}_l^2$, $\hat{\mu}_u$ and $\hat{\mu}_l$ are the estimated variances and means of the upper and lower mode distributions.

The bi-modality of $c_1(n)$ can be attributed to the inherent switching between two mutually exclusive Gaussian processes of different means. For simplification, the mode distribution weight E is assumed to be 0.5 and that assumption is rationalized by the fact that maxima and minima of the upper and lower envelopes are almost equally likely and symmetrically distributed around the zero overall mean of the signal.

Analytically, the scaling factor β can be expressed as the ratio of integrating the PSD of $IMF_1$ and the received signal, r(n)=w(n), in terms of extrema (maxima/minima) distribution. The extrema are equally spaced with the maxima being located at integer time instants and the minima at half the distance between a pair of consecutive maxima. For the case of cubic spline interpolation, the frequency response of the unit spaced knots $I(v)$ may be given as:

$$I(v) = \left(\frac{\sin\pi v}{\pi v}\right)^4 \frac{3}{2+\cos 2\pi v} \quad \text{(Equation 5)}$$

The PSD of the first IMF, $S_{c_1}(v)$, may be given by:

$$S_{c_1}(v) = |(1-I(3v))|^2 S_w(v)(0 \le v < \frac{1}{2}) \quad \text{(Equation 6)}$$

where $S_w(v)$ is the PSD of the received signal $w(n)$. Thus, the corresponding ratio $\hat{\beta}$ may be given by:

$$\hat{\beta} = \frac{\int_0^{1/2} S_{c_1}(v)dv}{\int_0^{1/2} S_w(v)dv} \quad \text{(Equation 7)}$$

The scaling factor, $\hat{\beta}$, as given in Equation (7) is the result of the first iteration (through the sifting process) to obtain $IMF_1$. The $\hat{\beta}$ in Equation (7) is not as generic as the one given in Equation (8) however, it is presented here to provide further validating evidence for the EMD-based noise estimator approach disclosed herein.

Figure 6:
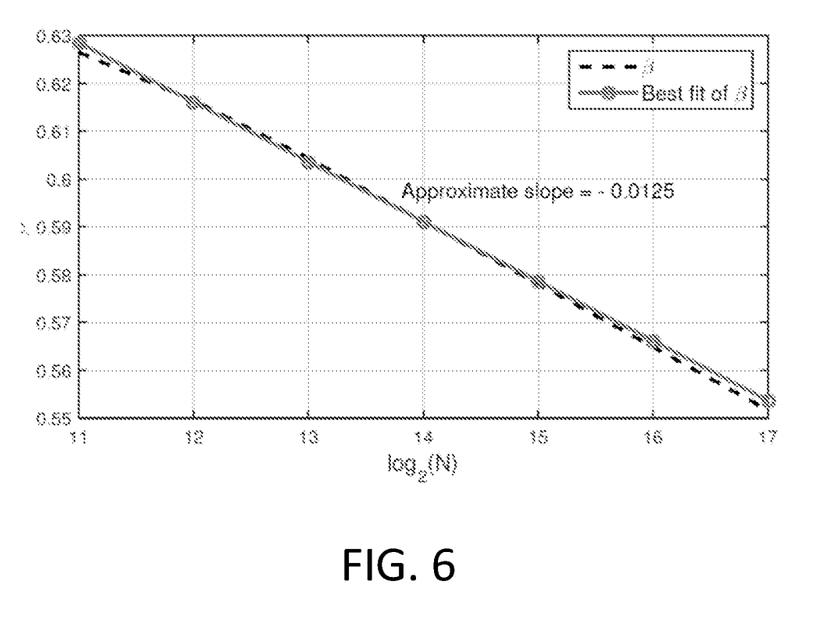
FIG. 6 includes plots to compare an EMD-based noise estimation process consistent with the present disclosure with a best-fit linear regression model.

The ratio, $\beta$, plays the role of a scaling factor that can be used to estimate $\sigma_w^2$. FIG. 6 shows a comparison of $\beta$, dashed line, to the best fit linear regression model, solid line, when $r(n)=w(n)$. This disclosure has identified that $\beta$ can be approximated by a simple function of the sample size, N, of the received signal:

$$\beta(N) = S \log_2(N) + \beta(1) \quad \text{(Equation 8)}$$

where $\beta(1)$ is the y-intercept of the best fit linear model using polynomial least-squares and S is the linear fit slope. From FIG. 6, the sample size, N, is represented logarithmically in order to linearize the trend of $\beta$.

These $\beta$ values maintain a linear trend over different sample size values and validate the model in Equation (8). According to Equation (8), and for a sample size N, the estimated noise power, $\hat{\sigma}_w^2$, of the received signal $r(n)$ can be given as:

$$\hat{\sigma}_w^2 = \frac{\hat{\sigma}_{c_1}^2}{\beta(N)} \quad \text{(Equation 9)}$$

Figure 7:
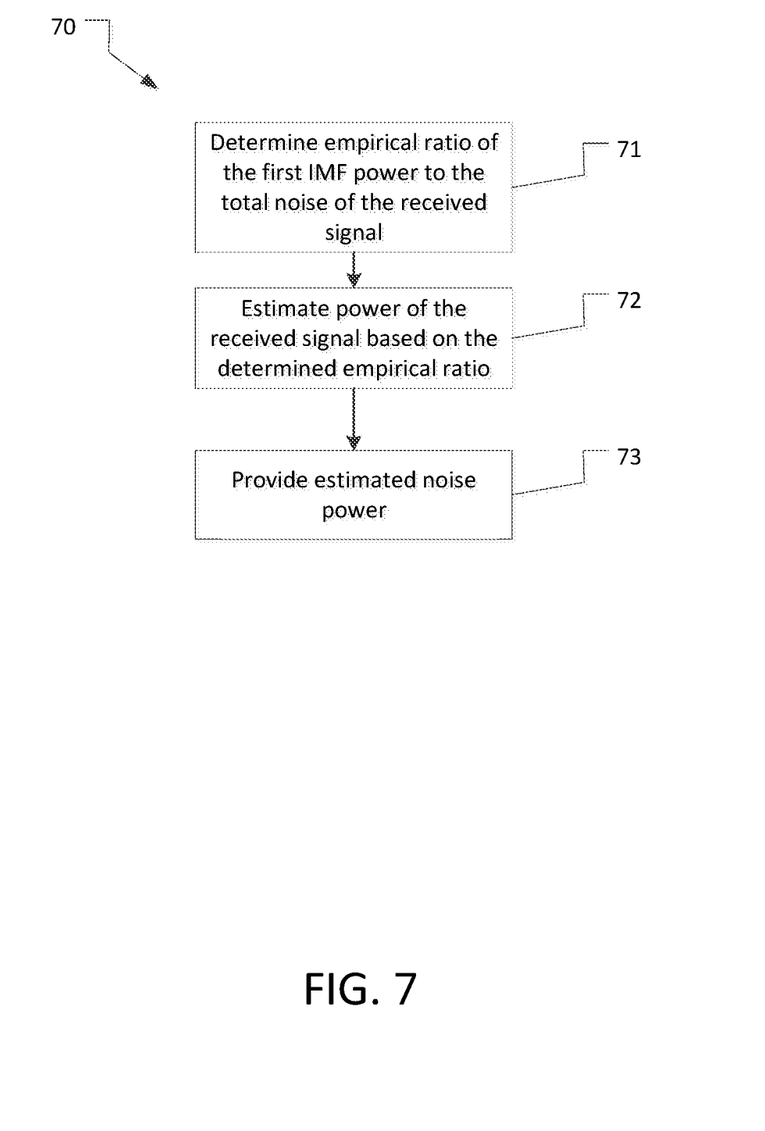
FIG. 7 is a flowchart illustrating operation of one example of an EMD-based noise estimation process consistent with the present disclosure.

In summary, therefore, the EMD-based noise estimation circuit 39 consistent with the present disclosure may use an EMD process to determine the total noise power of a received signal. FIG. 7 is a flow chart illustrating one exemplary embodiment 70 of an EMD-based noise estimation method that may be performed by an EMD-based noise estimator circuit consistent with the present disclosure. Exemplary details of the operations shown in FIG. 7 are discussed above. As shown, the method 70 includes determining 71 an empirical ratio of the first IMF power to the total noise of the received signal using, for example, Equation (3), estimating 72 power of the received signal based on the determined empirical ratio, and providing the estimated noise power (which may also be referred to as a noise power estimate, noise power output, or simply noise power).

Continuing on, and from the context of the detector circuit 38 (FIG. 3) being an EMD-based energy detector, once the IMFs are calculated and the bandwidth of interest is confirmed to be either entirely vacant, i.e. the entire bandwidth may be considered available spectrum, or to include at least one occupied channel, the IMFs may be de-noised by filtering or smoothing. De-noising may be advantageous in an embodiment of a system and method consistent with the present disclosure when there is a large variation of the magnitudes of different IMFs associated with a signal. Large variations in IMF magnitudes may affect the derivation of the threshold used for detection.

To de-noise the IMFs, a filter, such as a known Savitzky-Golay (S-G) filter, or polynomial smoothing may be applied to the IMFs. An S-G filter, for example, is a generalization of a finite-impulse-response (FIR)-averaged filter with non-linear characteristics. An S-G filter may be used to reduce noise while maintaining the shape and height of the IMF waveforms. Spectral peaks in the IMFs due to the noise power may have a negative influence on the setting of the threshold. Accordingly, the frame size and the polynomial order of the S-G filter may be selected to provide smoothing of the peaks while retaining the spectral height of the IMFs. Selecting a low or high order filter with a small frame size may yield poor smoothing. However, increasing the filter order with relatively large frame size has been found to produce better smoothing and retain the spectrum height. In one embodiment, for example, it has been found that an S-G filter with a polynomial of third order and a frame size of 41 achieved a tradeoff between the IMF heights and the smoothing of the IMFs in their frequency-domain representation. The filtered IMFs can be represented as:

$$\overline{C}_i(f) = j! \sum_{m=-K}^{K} g_j(-m) \hat{C}_i^{(j)}(f-m) \quad \text{(Equation 10)}$$

where $\overline{C}_i$ is the filtered signal of $i^{th}$ IMF, K is the frame size, $g_j$ is the polynomial coefficient, and j is the polynomial order.

Therefore, in a system and method consistent with the present disclosure the filtered IMFs may be reconstructed and compared against a data-driven threshold (or detection threshold) derived from the noise power output received from an EMD-based noise estimator, e.g., the EMD-based noise estimator circuit 39 (FIG. 3). The data-driven threshold may be determined adaptively using the process 70 of FIG. 7, for example.

Once the data-driven threshold is determined the filtered IMFs may be reconstructed according to:

$$C_r(f) = \sum_{i=1}^{M} \overline{C}_i(f) \quad \text{(Equation 11)}$$

The reconstruction of the IMFs, $C_r(f)$, is compared to the calculated threshold $\lambda_d$ to determine whether portions of the bandwidth of interest occupied or available.

In summary, therefore, the detector circuit 38 consistent with the present disclosure may use an EMD process and the data-driven threshold, e.g., estimated noise power from the EMD-based noise estimation circuit 39, to determine whether portions of a bandwidth of interest comprise available spectrum or occupied spectrum. Note, the detector circuit 38 may also implement other known spectrum analysis circuits and this disclosure should not be construed as limiting in this regard.

Figure 8:
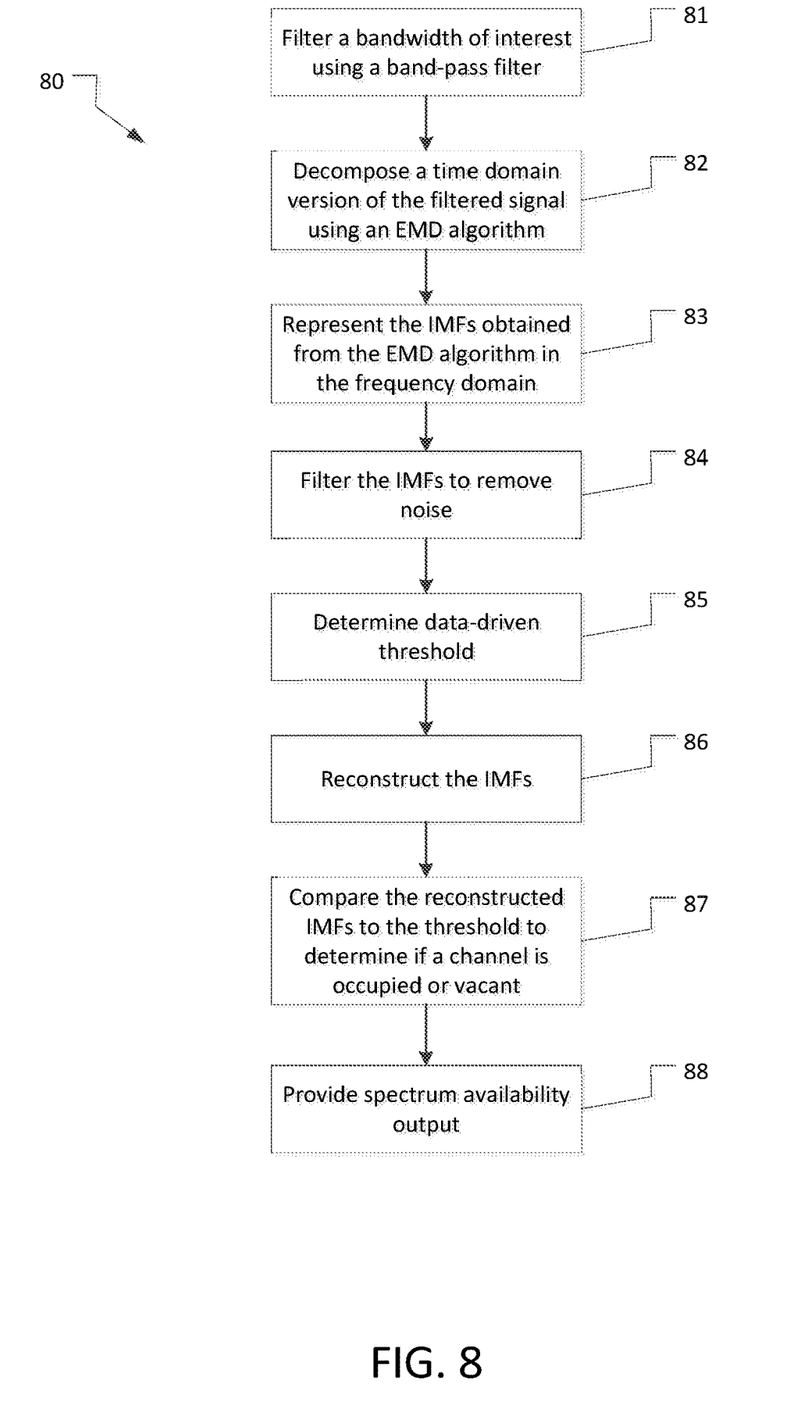
FIG. 8 is a flowchart illustrating operation of one example of an EMD-based energy detector process consistent with the present disclosure.

FIG. 8 is a flow chart illustrating one exemplary embodiment 80 of an EMD-based energy detection method that may be performed by an EMD-based energy detector circuit consistent with the present disclosure. Exemplary details of the operations shown in FIG. 8 are discussed above. As shown, the method includes filtering 81 a bandwidth of interest using a band pass filter (e.g. filter 34 in FIG. 3), and then decomposing 82 a digital time domain version of the filtered output using an EMD process. The IMFs obtained using the EMD process may then be represented 83 in the frequency domain, e.g. according to:

$$\hat{C}_i(f) = \frac{1}{N} \sum_{n=0}^{N-1} |C_i(n) e^{\frac{-2\pi i f n}{N}}|^2 \qquad \text{(Equation 12)}$$

where N is number of samples of the digital time domain signal x(n), f is a number of frequency bins, and $\hat{C}_i$ is the $i^{th}$ frequency-domain IMF. Each IMF may then be filtered 84 to remove noise, e.g. using a S-G filter of the third order, and the data-driven threshold $\lambda_d$ may be determined 85 based on the estimated noise power, e.g. using the EMD-based noise estimator circuit 39. The filtered IMFs may then be reconstructed 86, e.g. according to equation (11), and the reconstructed IMFs may be compared 87 to the threshold. If any selected channel or other portion of the bandwidth of an IMF exceeds the threshold, the channel is deemed to be occupied. Otherwise, the channel or bandwidth is available spectrum that is available for use. A spectrum availability output may then be provided 88.

Experimental Methodologies and Results

Consistent with aspects of the present disclosure a signal-driven (or data-driven) noise power estimation method/process is variously disclosed herein. The following experimental results were based on transitioning two known detector implementations, namely forward consecutive mean excision (FCME) and Wavelet, from semi-blind to fully-blind, which is to say from approaches that require some amount of a priori knowledge about a target signal to approaches that leverage the EMD-based noise estimation techniques disclosed herein to operate fully-blind.

The EMD-based noise estimation techniques disclosed herein take advantage of an observed unique ratio, $\beta$, between the $IMF_1$ power and the total noise power in the received signal. The performance of the proposed EMD-based noise estimation process was further tested through upgraded/modified detectors and the results are compared to other estimation schemes, as discussed further below. The proposed noise estimation method disclosed herein outperforms other schemes at low SNR across a range of signal types.

The following assumes a configuration of one primary user (PU) and one secondary user (SU) node with an additive white Gaussian noise (AWGN) channel and a single channel spectrum scanner with a band pass filter (BPF). An OFDM-modulated communication signal is synthesized with a known noise power. The results are carried out through a Monte-Carlo simulation by averaging 2000 runs.

Figure 9:
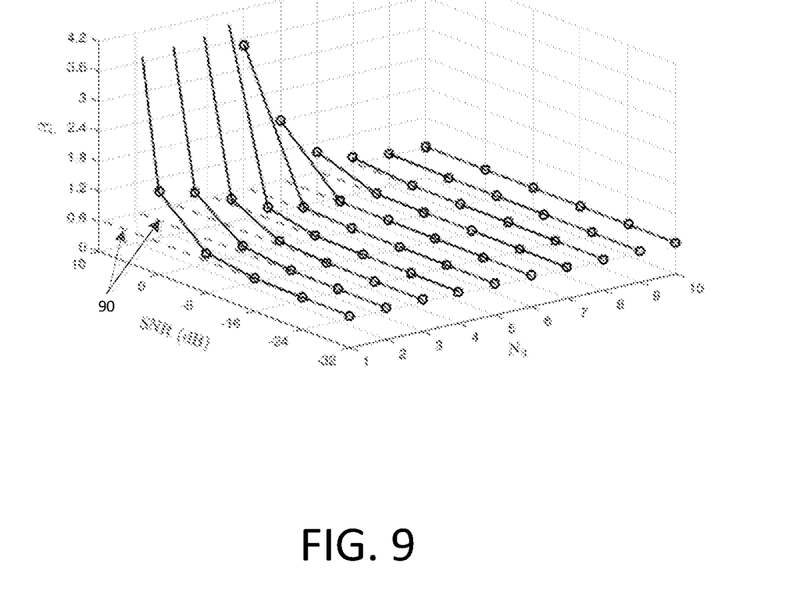
FIG. 9 includes plots showing an EMD-based noise estimation process consistent with the present disclosure relative to a Gaussian noise-only signal at various SNR values.

First, we show the boundaries of the EMD-based noise estimation process ($\beta$) variously disclosed herein under different values of Signal-to-Noise Ratio (SNR) and sampling rates, Nyquist rate, (N_q=2f_max). In FIG. 9, a received Gaussian noise-only signal 90 (dotted gray line) is used as a reference to compare the same with the scenario of a noisy signal.

From FIG. 9 the results demonstrate that for low sampling rates $\beta$ from Equation (8) will perform relatively well only at low SNR values, e.g., at about <−8 dB, as the noise will dominate the signal and closely resemble a noise-only signal scenario. However, for higher sampling rates, e.g., ≥to about 8N_q, $\beta$ will perform in a very similar way to the noise-only case. The deviation of $\beta$ at low sampling rate and high SNR values occurs because $IMF_1$ sifts part of the signal in addition to the noise and increases the corresponding variance. Therefore, to ensure the proper functionality of the proposed $\beta$ model at wide range of SNR values, oversampling was considered a requirement for the test signals utilized herein.

Figure 10:
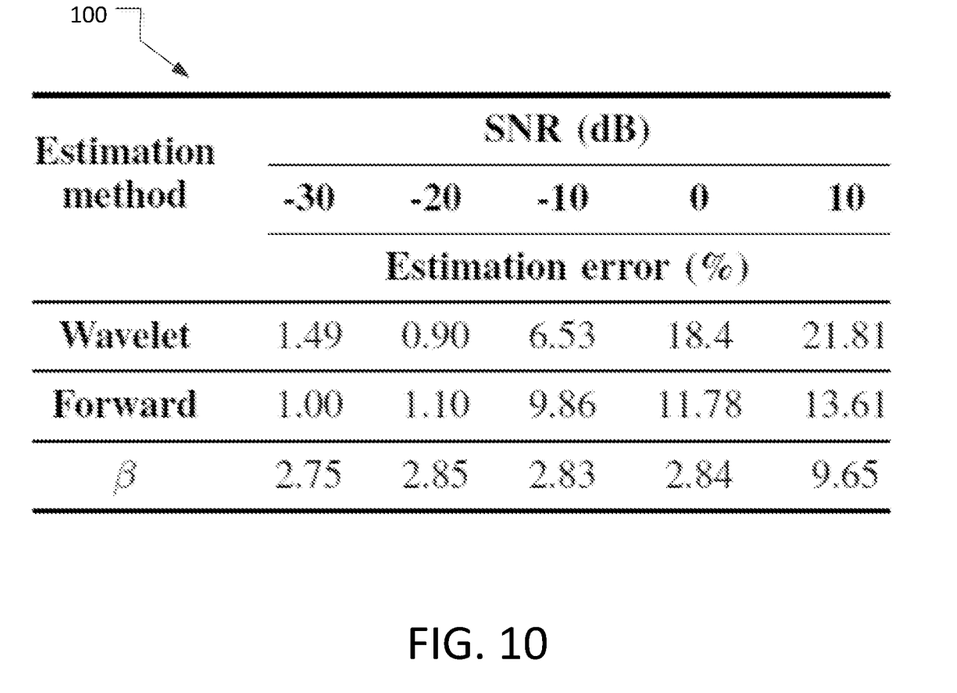
FIG. 10 is a table showing the percentage error for an EMD-based noise estimation process consistent with the present disclosure relative to various other transform-based noise estimation methods.

The EMD-based noise estimation model of equation (8) was further evaluated using a percentage error metric in which the true noise, σ_w^2, of the received signal was used as a reference. FIG. 10 includes a table 10 that shows a comparison between the proposed $\beta$ model and two other transform-based estimation techniques: Forward consecutive mean excision (FCME) and Wavelet noise estimation methods. Table 10 shows that at low SNR values (<−10 dB) both the FCME and wavelet methods performed slightly better than the proposed method. However, both methods exhibit a rapid degradation in the noise estimation performance as the SNR increases (≥−10 dB) and that is expected due to the domination of the signal features over the noise in which these techniques fail to differentiate the signal from the noise. In comparison, $\beta$ method, i.e., the EMD-based noise estimation approach variously disclosed herein, has steady performance over all SNR values except at SNR≥10 dB where $IMF_1$ starts to sift signal components in addition to the noise. The degradation of the proposed model can be mitigated by increasing the sampling rate, which guarantees that $IMF_1$ will be predominantly populated by noise samples only.

Figure 11:
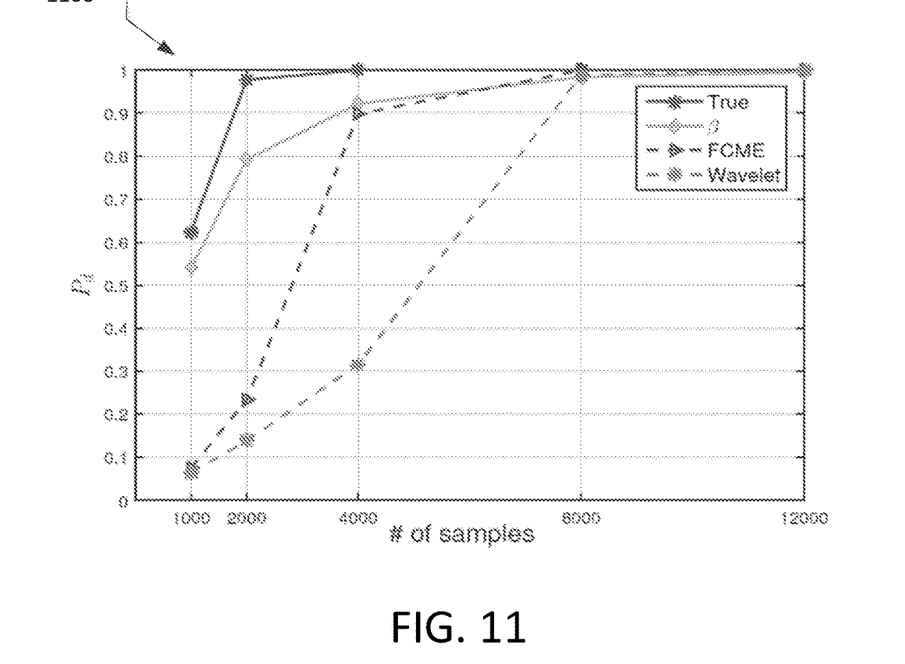
FIG. 11 includes plots showing performance of an energy detector (ED) modified with an EMD-based noise estimation process consistent with the present disclosure relative to other methods with known or true noise.

In FIG. 11, a graph 1100 illustrates the performance of ED modified with an EMD-based noise estimator ($\beta$) relative to a conventional FCME and Wavelet approach. In FIG. 11, the probability of detection, $P_d$, is used as a metric to evaluate the performance of each approach with the known or true noise with probability of false alarm, $P_{fa}$ at 0.1 and SNR=−12 dB. As shown, the $\beta$ approach performs substantially as well as the truse noise particularly at a low number of samples.

The Receiver Operating Characteristic (ROC) was also used as a performance metric for both ED and MED using different noise estimation methods in which 2000 samples represent a sensing cycle of 625 μs at 8N_q. The SNRs in FIGS. 12 and 13 were chosen to best reflect the performance of each method in real-world circumstances.

Figure 12:
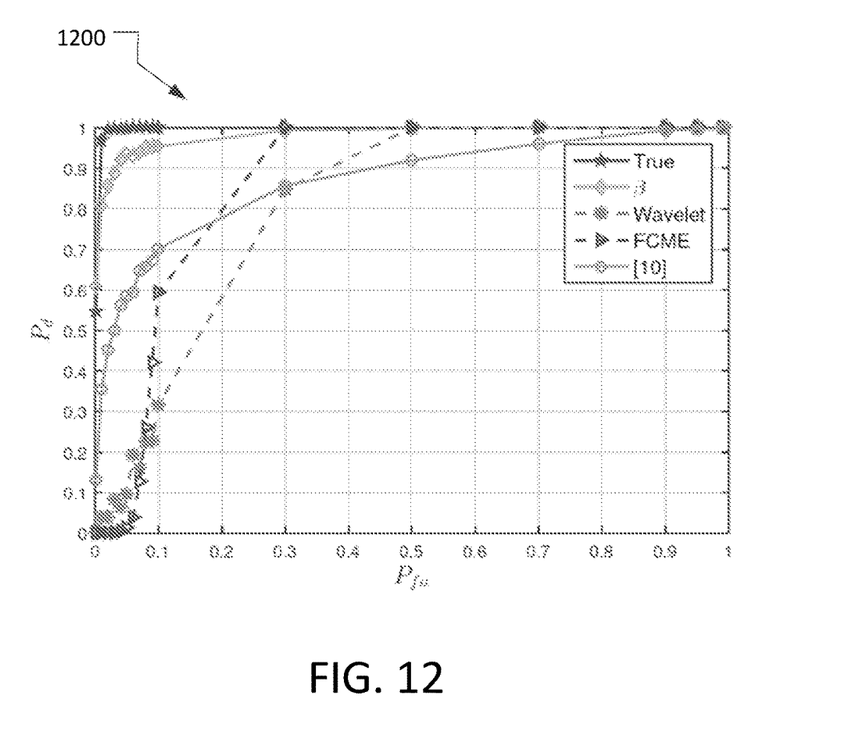
FIG. 12 includes plots showing performance of an ED modified with EMD-based noise estimation process consistent with the present disclosure, at an SNR of −10 dB, relative to other transform-based noise estimation methods.

In FIG. 12, a graph 1200 shows performance of an ED modified with an EMD-based noise estimator ($\beta$), at −10 dB, relative to different transform-based noise estimation methods (e.g., Wavelet, FCME and Maximum-Minimum Eigenvalue noise estimator denoted as [10]) as well as a model-based method with a smoothing factor of 50.

Figure 13:
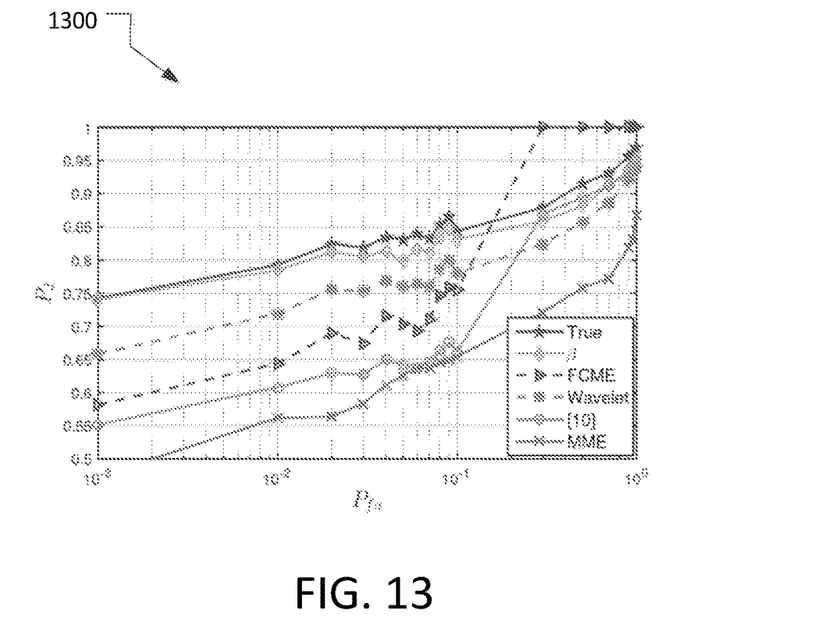
FIG. 13 includes plots showing performance of a Maximum-Minimum Eigenvalue energy detector (MED) modified with EMD-based noise estimation process consistent with the present disclosure, at an SNR of −14 dB, relative to other noise estimation methods.

In FIG. 13, a graph 1300 illustrates the performance a MED technique modified with an EMD-based noise estimator ($\beta$) at SNR of −14 dB for the same noise estimation methods as shown in FIG. 12. For comparison, a fully-blind spectrum sensing technique, Maximum-Minimum Eigenvalue (MME), computed with 6000 samples was added to FIG. 13.

As shown in FIGS. 12 and 13, it is demonstrated that the EMD-based noise estimation approach ($\beta$) of the present disclosure outperforms other estimators in addition to the MME technique which requires a much higher sampling rate. The $\beta$ approach performs close to true noise for the assigned SNR value and number of samples. In addition, the degradation of other method's performance is due to the estimation error as SNR values increase. While Wavelet and FCME show slightly better noise estimation error (see FIG. 10) compared with the β approach of the present disclosure, that does not mean they can be used for very low SNR detection. The reason is that for the number of samples used during the aforementioned simulations, each detector will have an SNR wall that can not be exceeded even if the number of samples is increased infinitely.

Figure 14:
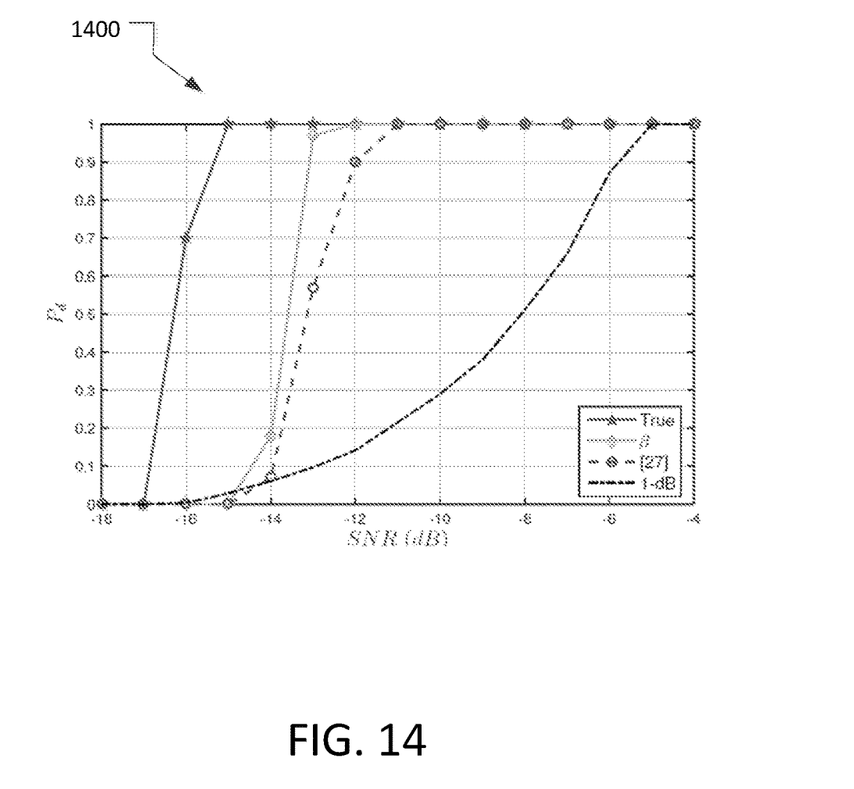
FIG. 14 includes plots that show detection probability of an ED modified with EMD-based noise estimation process consistent with the present disclosure relative to other ED methods using the DVB-T model parameters with $P_{fa}=0.01$.

Finally, the performance of the proposed EMD-based noise estimation approach of the present disclosure was compared to the noise estimation given using ED. FIG. 14 shows a graph 1400 that illustrates the detection probability of the ED methods using the DVB-T model parameters with P_fa=0.01. In addition, the noise uncertainty (1 dB) is presented to reveal the effect of noise fluctuation on the detector performance. The ED with the true noise exhibits the best performance in contrast to the worst performance of 1-dB noise uncertainty. The EMD-based noise estimation approach of the present disclosure shows a slightly better performance compared to pilot periodicity noise estimation denoted as [27]. Unlike pilot periodicity noise estimation [27], which is specifically designed for DVB-T signals, the proposed EMD-based noise estimation approach can work for a wider range of modulation schemes.

One aspect of the present disclosure discloses a system, the system comprising an empirical mode decomposition (EMD)-based noise estimator to decompose a received signal into a plurality of intrinsic mode functions (IMFs) and provide a noise estimation output based on the plurality of IMFs, the noise estimation output being based at least in part on a ratio ($\beta$) of a power of a first IMF of the plurality of IMFs to a total noise power of the received signal.

Another aspect of the present disclosure discloses a method of estimating noise power in a signal of interest. The method comprising receiving, by a controller, a signal, decomposing, by the controller, the received signal into a plurality of intrinsic mode functions (IMFs) using an empirical mode decomposition (EMD) process, the plurality of IMFs comprising $IMF_1$ to $IMF_X$, determining, by the controller, a ratio ($\beta$) of $IMF_1$ power to a total noise power of the received signal, and determining, by the controller, a noise power output based on the ratio ($\beta$).

Another aspect of the present disclosure discloses an EMD-based method of estimating noise power in a bandwidth of interest. The method comprising receiving, by a controller, a signal comprising a bandwidth of interest, decomposing, by the controller, the signal into a plurality of intrinsic mode functions (IMFs) using an empirical mode decomposition (EMD) process, the plurality of IMFs comprising $IMF_1$ to $IMF_X$, determining, by the controller, a ratio ($\beta$) of $IMF_1$ power to a total noise power of the received signal, determining, by the controller, a noise power output based on the ratio ($\beta$), determining, by the controller, a detection threshold based on the noise power output, and comparing each IMF of the plurality of IMFs to the detection threshold to determine which portions of the bandwidth of interest are available spectrum.

Embodiments of the methods described herein may be implemented using a processor and/or other programmable device. To that end, the methods described herein may be implemented on a tangible, computer readable storage medium having instructions stored thereon that when executed by one or more processors perform the methods. Thus, for example, the transmitter and/or receiver may include a storage medium (not shown) to store instructions (in, for example, firmware or software) to perform the operations described herein. The storage medium may include any type of non-transitory tangible medium, for example, any type of disk including floppy disks, optical disks, compact disk read-only memories (CD-ROMs), compact disk re-writables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

It will be appreciated by those skilled in the art that any block diagrams herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown. Software modules, or simply modules which are implied to be software, may be represented herein as any combination of flowchart elements or other elements indicating performance of process steps and/or textual description. Such modules may be executed by hardware that is expressly or implicitly shown.

The functions of the various elements shown in the figures, including any functional blocks, may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

As used in any embodiment herein, "circuit" or "circuitry" may comprise, for example, singly or in any combination, hardwired circuitry, programmable circuitry, state machine circuitry, and/or firmware that stores instructions executed by programmable circuitry. In at least one embodiment, the transmitter and receiver may comprise one or more integrated circuits. An "integrated circuit" may be a digital, analog or mixed-signal semiconductor device and/or microelectronic device, such as, for example, but not limited to, a semiconductor integrated circuit chip. The term "coupled" as used herein refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals. As used herein, use of the term "nominal" or "nominally" when referring to an amount means a designated or theoretical amount that may vary from the actual amount.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed is:

1. A system comprising:
An empirical mode decomposition (EMD)-based noise estimator to:
decompose a received signal into a plurality of intrinsic mode functions (IMFs) and provide a noise estimation output based on the plurality of IMFs, the noise estimation output being based at least in part on a ratio ($\beta$) of a power of a first IMF of the plurality of IMFs to a total noise power of the received signal; and
a detector circuit to provide a spectrum availability output based on the noise estimation output provided from the EMD-based noise estimator, the spectrum availability output indicating a portion of a bandwidth of interest that is available spectrum based on the portion of the bandwidth of interest not carrying an information signal, and wherein the detector circuit is configured to provide the spectrum availability output by selecting a channel or other portion of the bandwidth of interest that is available for use.

2. The system of claim 1, wherein the detector circuit is configured to derive a detection threshold based on the noise estimation output.

3. The system of claim 2, wherein the detector circuit determines the spectrum availability output based on the detection threshold.

4. The system of claim 1, the system further comprising a cognitive radio system configured for communication on the available spectrum based on the spectrum availability output.

5. The system of claim 1, the system further comprising a detection system for causing an alarm when unauthorized use of available spectrum is detected based on the spectrum availability output.

6. The system of claim 2, wherein the detector circuit is an EMD-based energy detector, and wherein the EMD-based energy detector is further configured to derive the detection threshold using the noise estimation output, and to compare the plurality of IMFs to the derived detection threshold to determine the portions of the bandwidth of interest is the available spectrum.

7. The system of claim 1, wherein the ratio ($\beta$) is given by:

$$\beta = \frac{\hat{\sigma}_{c_1}^2}{\sigma_w^2}$$

where $\hat{\sigma}_{c_1}^2$ is an estimated overall variance of the first IMF and $\sigma_w^2$ is the total noise power for the received signal.

8. The system of claim 1, wherein the EMD-based noise estimator is implemented within a digital signal processor (DSP).

9. A method of estimating noise power in a signal of interest, the method comprising:
receiving, by a controller, a signal;
decomposing, by the controller, the received signal into a plurality of intrinsic mode functions (IMFs) using an empirical mode decomposition (EMD) process, the plurality of IMFs comprising $IMF_1$ to $IMF_X$;
determining, by the controller, a ratio ($\beta$) of $IMF_1$ power to a total noise power of the received signal;
determining, by the controller, a noise power output based on the ratio ($\beta$);
determining, by the controller, a detection threshold based on the noise power output;
comparing, by the controller, each of the IMFs to the detection threshold to determine a portion of a bandwidth of interest that is available spectrum based on the portion of the bandwidth of interest not carrying an information signal;
outputting, by the controller, an indication of the determined portion of the bandwidth of interest that is available spectrum; and
wherein outputting the indication of the determined portion of the bandwidth of interest that is the available spectrum further includes selecting a channel or other portion of the bandwidth of interest that is available for use.

10. The method of claim 9, further comprising reconstructing the plurality of IMFs, and wherein comparing each of the IMFs to the detection threshold comprises comparing the reconstructed IMFs to the detection threshold.

11. The method of claim 9, wherein the ratio ($\beta$) is given by:

$$\beta = \frac{\hat{\sigma}_{c_1}^2}{\sigma_w^2}$$

where $\hat{\sigma}_{c_1}^2$ is an estimated overall variance of $IMF_1$ and $\sigma_w^2$ is the total noise power of the received signal.

12. The method of claim 9, further comprising providing, by the controller, the determined noise power output to an energy detector (ED).

13. The method of claim 12, wherein the ED is a Maximum Eigenvalue Detector (MED).

14. An EMD-based method of estimating noise power in a bandwidth of interest, the method comprising:
receiving, by a controller, a signal comprising a bandwidth of interest;
decomposing, by the controller, the signal into a plurality of intrinsic mode functions (IMFs) using an empirical mode decomposition (EMD) process, the plurality of IMFs comprising $IMF_1$ to $IMF_X$;
determining, by the controller, a ratio ($\beta$) of $IMF_1$ power to a total noise power of the received signal;
determining, by the controller, a noise power output based on the ratio ($\beta$);
determining, by the controller, a detection threshold based on the noise power output; and
comparing, by the controller, each IMF of the plurality of IMFs to the detection threshold to determine a portion of the bandwidth of interest that is available spectrum based on the portion of the bandwidth of interest not carrying an information signal, and outputting an indication of the portion of the bandwidth of interest that is available spectrum, and wherein outputting the indication of the portion of the bandwidth of interest that is the available spectrum further includes selecting a channel or other portion of the bandwidth of interest that is available for use.

15. The method of claim 14, wherein the ratio ($\beta$) is given by:

$$\beta = \frac{\hat{\sigma}_{c_1}^2}{\sigma_w^2}$$

where $\hat{\sigma}_{c_1}^2$ is an estimated overall variance of $IMF_1$ and $\sigma_w^2$ is the total noise power of the received signal.

* * * * *